(12) United States Patent
Kirchmeier et al.

(10) Patent No.: US 8,421,377 B2
(45) Date of Patent: Apr. 16, 2013

(54) PROTECTING HIGH-FREQUENCY AMPLIFERS

(75) Inventors: Thomas Kirchmeier, Teningen (DE); Michael Glueck, Freiburg (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 263 days.

(21) Appl. No.: 12/686,023

(22) Filed: Jan. 12, 2010

(65) Prior Publication Data

US 2010/0171427 A1 Jul. 8, 2010

Related U.S. Application Data

(63) Continuation of application No. PCT/EP2008/005991, filed on Jul. 22, 2008.

(60) Provisional application No. 60/951,392, filed on Jul. 23, 2007.

(51) Int. Cl.
*H05B 37/00* (2006.01)

(52) U.S. Cl.
USPC ............ 315/326; 315/291; 315/299; 315/308

(58) Field of Classification Search ............. 315/121.11, 315/299, 326, 308, 111.21, 291
See application file for complete search history.

(56) References Cited

U.S. PATENT DOCUMENTS

| | | | |
|---|---|---|---|
| 3,820,008 A | 6/1974 | Guarnaschelli | |
| 4,053,848 A | 10/1977 | Kleische | |
| 4,215,392 A | 7/1980 | Rhoads | |
| 4,490,684 A | 12/1984 | Epsom et al. | |
| 4,656,434 A | 4/1987 | Selin | |
| 4,701,716 A | 10/1987 | Poole | |

(Continued)

FOREIGN PATENT DOCUMENTS

| | | |
|---|---|---|
| DE | 10262286 B4 | 3/2009 |
| EP | 0073059 | 3/1983 |

(Continued)

OTHER PUBLICATIONS

De Vries et al., "Solid State Class DE RF Power Source", Proc. IEEE International Symposium on Industrial Electronics (ISIE'98), vol. 2, pp. 524-529, Pretoria, South Africa, Jul. 1988.

(Continued)

*Primary Examiner* — Thuy Vinh Tran
*Assistant Examiner* — Anthony Arpin
(74) *Attorney, Agent, or Firm* — Fish & Richardson P.C.

(57) ABSTRACT

In one aspect, protecting high frequency (HF) amplifiers of a plasma supply device configured to deliver >500 W at a substantially constant fundamental frequency >3 MHz is accomplished by: driving two HF amplifiers with two drive signals having a common frequency and a predetermined phase shift with respect to one another; generating two HF source signals using the HF amplifiers, the HF source signals coupled in a coupler to form a HF output signal; transmitting the HF output signal to the plasma load; measuring electrical variables related to the load impedances seen by the two HF amplifiers; determining whether the load impedance seen by one of the HF amplifiers lies outside a predetermined range; and adjusting the phase shift of the two drive signals, wherein neither of the load impedances seen by the HF amplifiers lies outside the predetermined range.

16 Claims, 4 Drawing Sheets

U.S. PATENT DOCUMENTS

| | | | |
|---|---|---|---|
| 4,758,941 A | 7/1988 | Felton et al. | |
| 4,860,189 A | 8/1989 | Hitchcock | |
| 4,910,452 A | 3/1990 | Dickens et al. | |
| 4,921,357 A | 5/1990 | Karube et al. | |
| 4,980,810 A | 12/1990 | McClanahan et al. | |
| 5,195,045 A | 3/1993 | Keane et al. | |
| 5,222,246 A * | 6/1993 | Wolkstein | 455/13.4 |
| 5,225,687 A | 7/1993 | Jason | |
| 5,363,020 A | 11/1994 | Chen et al. | |
| 5,382,344 A | 1/1995 | Hosokawa et al. | |
| 5,394,061 A | 2/1995 | Fujii | |
| 5,424,691 A | 6/1995 | Sadinsky | |
| 5,434,527 A | 7/1995 | Antone | |
| 5,435,881 A | 7/1995 | Ogle | |
| 5,438,498 A | 8/1995 | Ingemi | |
| 5,523,955 A | 6/1996 | Heckman | |
| 5,563,775 A | 10/1996 | Kammiller | |
| 5,574,410 A | 11/1996 | Collins et al. | |
| 5,610,452 A | 3/1997 | Shimer et al. | |
| 5,635,762 A | 6/1997 | Gamand | |
| 5,810,963 A | 9/1998 | Tomioka | |
| 5,875,103 A | 2/1999 | Bhagwat et al. | |
| 5,944,942 A | 8/1999 | Ogle | |
| 6,038,142 A | 3/2000 | Fraidlin et al. | |
| 6,084,787 A | 7/2000 | Nyberg et al. | |
| 6,130,831 A | 10/2000 | Matsunaga | |
| 6,229,718 B1 | 5/2001 | Nilssen | |
| 6,246,599 B1 | 6/2001 | Jang et al. | |
| 6,297,696 B1 | 10/2001 | Abdollahian et al. | |
| 6,313,584 B1 | 11/2001 | Johnson et al. | |
| 6,344,768 B1 | 2/2002 | Daun-Lindberg et al. | |
| 6,365,868 B1 | 4/2002 | Borowy et al. | |
| 6,703,080 B2 | 3/2004 | Reyzelman et al. | |
| 6,704,203 B2 | 3/2004 | Chapuis et al. | |
| 6,760,234 B2 | 7/2004 | Yuzurihara et al. | |
| 6,791,851 B2 | 9/2004 | Brkovic | |
| 6,909,617 B1 | 6/2005 | Mirskiy | |
| 6,971,851 B2 | 12/2005 | Liang | |
| 6,992,902 B2 | 1/2006 | Jang et al. | |
| 6,996,892 B1 | 2/2006 | Dening et al. | |
| 7,138,861 B2 * | 11/2006 | Sundstrom et al. | 330/124 R |
| 7,161,818 B2 | 1/2007 | Kirchmeier et al. | |
| 7,244,343 B2 | 7/2007 | Watanabe et al. | |
| 7,259,623 B2 | 8/2007 | Coleman | |
| 7,312,584 B2 | 12/2007 | Tamita et al. | |
| 7,333,348 B2 | 2/2008 | Horiuchi et al. | |
| 7,353,771 B2 | 4/2008 | Millner et al. | |
| 7,403,400 B2 | 7/2008 | Stanley | |
| 7,452,443 B2 | 11/2008 | Gluck et al. | |
| 7,616,462 B2 | 11/2009 | Millner et al. | |
| 7,755,300 B2 | 7/2010 | Kishinevsky et al. | |
| 7,796,005 B2 | 9/2010 | Blankenship et al. | |
| 7,872,523 B2 * | 1/2011 | Sivakumar et al. | 330/10 |
| 7,884,590 B2 | 2/2011 | Liu | |
| 2003/0215373 A1 | 11/2003 | Reyzelman et al. | |
| 2004/0031566 A1 | 2/2004 | Takahashi et al. | |
| 2004/0105288 A1 | 6/2004 | Watanabe et al. | |
| 2004/0114399 A1 | 6/2004 | Lincoln et al. | |
| 2005/0088231 A1 | 4/2005 | Ziegler | |
| 2005/0088855 A1 | 4/2005 | Kirchmeier et al. | |
| 2005/0122087 A1 | 6/2005 | Sakai et al. | |
| 2005/0255809 A1 * | 11/2005 | Glueck | 455/69 |
| 2006/0158911 A1 | 7/2006 | Lincoln et al. | |
| 2006/0191880 A1 | 8/2006 | Kwon et al. | |
| 2006/0196426 A1 | 9/2006 | Gluck et al. | |
| 2006/0252283 A1 | 11/2006 | Takeda et al. | |
| 2007/0121267 A1 | 5/2007 | Kotani et al. | |
| 2007/0145900 A1 | 6/2007 | Kirchmeier et al. | |
| 2009/0153127 A1 | 6/2009 | Chen | |

FOREIGN PATENT DOCUMENTS

| | | |
|---|---|---|
| EP | 1272014 | 1/2003 |
| EP | 1783904 | 10/2005 |
| EP | 1701376 | 9/2006 |
| JP | 55082967 | 6/1980 |
| JP | 9120910 A | 5/1997 |
| JP | 10214698 A | 8/1998 |
| JP | 2001185443 A | 7/2001 |
| JP | 2002237419 A | 8/2002 |
| JP | 2005086622 A | 3/2005 |
| JP | 2006165438 A | 6/2006 |
| WO | 9749267 | 12/1997 |
| WO | 9857406 | 12/1998 |
| WO | 2005094138 | 6/2005 |

OTHER PUBLICATIONS

Walker et al., "An Isolated MOSFET Gate Driver". Australasian Universities Power Engineering Conference, AUPEC'96, 1996, vol. 1, Melbourne, pp. 175-180.

International Search Report from corresponding PCT Application No. PCT/EP2008/005991, mailed Feb. 23, 2009, 12 pages.

Notification of Transmittal of Copies of Translation of the International Preliminary Report on Patentability for corresponding PCT Application No. PCT/EP2008/005991, mailed Feb. 18, 2010, 8 pages.

* cited by examiner

PROTECTING HIGH-FREQUENCY AMPLIFERS

CROSS REFERENCE TO RELATED APPLICATION

This application is a continuation of PCT International Application No. PCT/EP2008/005991, filed Jul. 22, 2008, incorporated herein by reference, which claims priority under 35 U.S.C. §119(e) to U.S. Provisional App. No. 60/951,392, filed on Jul. 23, 2007.

TECHNICAL FIELD

The invention relates to a method for the protection of high-frequency (HF) amplifiers of a plasma supply device configured to deliver a high-frequency output signal having a power of >500 W and a substantially constant fundamental frequency >3 MHz to a plasma load.

BACKGROUND

A plasma is a special aggregate state, which is produced from a gas. Each gas essentially comprises atoms and/or molecules. In the case of a plasma, this gas is for the most part ionized. This means that by supplying energy the atoms or molecules are split into positive and negative charge carriers, that is, into ions and electrons. A plasma is suitable for the processing of workpieces, since the electrically charged particles are chemically extremely reactive and can also be influenced by electrical fields. The charged particles can be accelerated by means of an electrical field onto a workpiece, where, on impact, they are able to extract individual atoms from the workpiece. The separated atoms can be removed via a gas flow (etching), or deposited as a coating on other workpieces (thin-film production). Such processing by means of a plasma is used above all when extremely thin layers, in particular in the region of a few atom layers, are to be processed. Typical applications are semiconductor technology (coating, etching etc.), flat screens (similar to semiconductor technology), solar cells (similar to semiconductor technology), architectural glass coating (thermal protection, glare protection, etc.), memory media (CDs, DVDs, hard drives), decorative layers (colored glasses etc.) and tool hardening. These applications make great demands on accuracy and process stability. Furthermore, a plasma can also be used to excite lasers, in particular gas lasers.

To generate a plasma from a gas, energy has to be supplied to the gas. This can be effected in different ways, for example, via light, heat, and/or electrical energy. A plasma for processing workpieces is typically ignited and maintained in a plasma chamber. To that end, normally a noble gas, e.g. argon, is introduced into the plasma chamber at low pressure. The gas is exposed to an electric field via electrodes and/or antennas. A plasma is generated and is ignited when several conditions are satisfied. First of all, a small number of free charge carriers must be present, such that the free electrons that for the most part are always present to a very small extent are used. The free charge carriers are so forcefully accelerated by the electrical field that as they collide with atoms or molecules of the noble gas they release additional electrons, thereby producing positively charged ions and additional negatively charged electrons. The additional free charge carriers are in turn accelerated and, as they collide, generate further ions and electrons. An avalanche effect commences. The discharges that occur as these particles collide with the wall of the plasma chamber or other objects and the natural recombination of the particles counteract the continuous generation of ions and electrons, i.e., electrons are attracted by ions and recombine to form electrically neutral atoms or molecules. For that reason, an ignited plasma must be constantly supplied with energy in order for it to be maintained.

The supply of energy can be effected via a dc supply device or an ac supply device. The following remarks relate to ac supply devices for high frequency (HF) with an output frequency of >3 MHz.

Plasmas have a very dynamic impedance, which renders the design of the desired uniform HF power supply difficult. For instance, during the ignition process the impedance changes very quickly from a high value to a low value. Negative effective resistances can occur during operation, which reduce the current flow as the voltage rises, and undesirable local discharges (arcs) may occur, which may damage the material to be processed, the plasma chamber or the electrodes.

Power supply devices for plasmas (plasma supply devices) must therefore be designed for a high output power and a high reflected power. EP 1 701 376 A1 has shown that such plasma supply devices can advantageously be achieved by relatively small high frequency amplifiers, the output powers of which are coupled by a coupler, preferably by a 3-dB coupler (e.g., hybrid coupler, Lange coupler, etc.). For that purpose, the two high frequency amplifiers are connected to two ports of the hybrid coupler, hereafter called port 1 and port 2. The high frequency amplifiers are driven in such a way that their high frequency signals of the same fundamental frequency have a phase shift of 90° with respect to one another. At a third port of the hybrid coupler the first of the two high frequency signals is present lagging by 45°, and the second of the two high frequency signals is present leading by 45°. At a fourth port of the hybrid coupler the first of the two high frequency signals is present leading by 45° and the second lagging by 45°. By phase shifting of the two generated high frequency signals by 90°, these add up at the third port by constructive superposition, whereas at the fourth port they cancel each other out (destructive superposition). The high frequency amplifiers upstream of the coupler thus each require only half the power of the required high frequency output signal. These coupler stages can be cascaded to enable the use of high frequency amplifiers with even less source power or to achieve an even higher power of the high frequency output signal.

The fourth port of the hybrid coupler is normally terminated with a terminating resistance of the system impedance (often 50Ω). As described in EP 1 701 376 A1, a high frequency signal is expected at this port only when a high frequency signal reflected by the plasma load is in turn reflected at the high frequency amplifiers.

In the case of mismatching due to different impedances of plasma supply device and plasma load, the power delivered by the plasma supply device is partially or fully reflected. An impedance matching circuit (matchbox) can transform the impedance of the plasma load in certain ranges and match it to the output impedance of the plasma supply device. If the transformation range of the matching circuit is exceeded, or if regulation of the impedance matching circuit cannot follow a rapid impedance change of the plasma, then the total power delivered by the plasma supply device is not absorbed in the plasma, but rather reflection occurs again.

A high frequency signal reflected by the plasma load runs via an optionally present matching circuit back to port 3 of the hybrid coupler where it is split into two parts and retransmitted via ports 1 and 2 towards the high frequency amplifiers of the plasma supply device. In the process, the two parts of the reflected high frequency signal again experience an equal phase delay by 45° en route from port 3 to port 1 and an equal phase lead by 45° en route from port 3 to port 2. The result being that, at both outputs of the two high frequency amplifiers, the forward and reflected high frequency signals are superimposed differently by 180°. If, for example, a maximum constructive superposition of forward and reflected high frequency signal takes place at the output of the first high frequency amplifier, then this superposition will have maximum destruction at the output of the second high frequency amplifier. If the superposition at the first high frequency amplifier is such that the current maximum is ahead of the voltage maximum in time, i.e. the high frequency amplifier sees a capacitive impedance as load impedance, then the voltage maximum will be ahead of the current maximum in time at the second high frequency amplifier, i.e. the second high frequency amplifier sees an inductive load impedance.

The two high frequency amplifiers can be driven, for example, by a common drive signal generator. This drive signal generator can have a phase shift of 90° for the high frequency control signals at its two outputs. The two high frequency amplifiers can also be driven by a common high frequency driver transmitter, the output signal of which is split, for example, by means of a second hybrid coupler.

Plasma supply devices having two high frequency amplifiers can also be constructed with couplers having other phase shift characteristics. The above-mentioned properties/advantages are only achieved, however, when the phase shift is 90° or close to that. A phase-shifting coupler can also be achieved, for example, by means of a 0°-coupler (Wilkinson coupler) and corresponding phase lag elements, for example, phasing lines.

One of the most common circuit variants of high frequency amplifiers in plasma current supplies is a class D amplifier with a switching bridge. A switching bridge has at least two switching elements, such as e.g. MOSFETs, which are connected in series; the junction of the switching elements represents the midpoint of the switching bridge. The midpoint of the bridge arm is connected alternately to the positive or negative pole of a power D.C. supply by the two switch elements (hereafter also called switching elements or switches). The alternating control of the two switch elements and of the switch elements of any second bridge arm present is effected by the drive signal generator, which can contain an oscillator, which determines the frequency of the output signal, and further components, such as inverters, phase shifters and signal formers.

A full bridge circuit consists of two bridge arms (half-bridges), the midpoints of which are connected at the desired frequency in each case inversely to the positive and negative pole of the D.C. supply. The alternating current load is arranged between these two midpoints. An additional capacitor to free the output signal from a D.C. offset is unnecessary.

To avoid switching losses, at the time the individual switch elements of a full bridge are switched on, there should be no appreciable voltage difference between the two power electrodes (generally drain and source of the MOSFET in question). This switching behavior is called zero voltage switching. This is achieved by the switching bridge operating on a load impedance having an inductive character. This means that the switching bridge, i.e. the high frequency amplifier, sees an inductively absorptive load impedance. The self-induction of a primary winding of a power transformer that is connected to the midpoint of the switching bridge can be used for that purpose. A voltage is induced upon the initially one-sided interruption of the current flow through the primary winding. When the components are of suitable dimensions and allowances are made for their parasitic properties, and with the correct choice of switching/delay time, the potential at this end of the primary winding which is momentarily disconnected from the power D.C. supply is just as high as the potential at the particular connection of the direct voltage source that is now to be connected to this end of the primary winding with this half-bridge.

In contrast, a load impedance of a capacitive character (the HF amplifier sees a capacitively absorptive load impedance) is unfavorable for the switching bridge, as the midpoint retains its previous potential during the switching-over procedure and thus, a voltage difference up to the voltage of the power D.C. supply is present at the element now switching on.

Under certain reflection conditions, it may even happen that one of the high frequency amplifiers supplies power to the other; the load impedance seen by this high frequency amplifier to which power is supplied has a negative effective resistance, and hence the output power of this high frequency amplifier becomes negative. The high frequency amplifier is, as it were, "fed." This means that the "fed" high frequency amplifier sees an emissive load impedance, which can be inductive or capacitive.

Depending on the operating states and the specifications of the components of the high frequency amplifiers, that is, how close to the specification limit these are operated with the supply voltage, how good the cooling is, how quickly the normal operation (switching operation) of the switching elements of the HF amplifier can be terminated/interrupted, how well zero voltage switching has to be realized, an admissible operating range arises. If therefore the load impedance lies in an operating range dependent on the component specifications and operating states of the HF amplifiers, the HF amplifiers can be operated without fear of damage or destruction. At the same time, certain (inductive) emissive load impedances may also be admissible. Load impedances outside the admissible load impedance range should be avoided.

SUMMARY

In one aspect of the invention, the operation of high frequency amplifiers of a plasma supply device with coupler is performed in such a way that they are protected from an unfavorable load impedance.

In particular, high frequency operating parameters, which arise as a plasma load is being supplied by a plasma supply device having two high frequency amplifiers at their outputs, are matched by generating two drive signals of identical fundamental frequency that have a phase-shift of 90° with respect to one another in order to generate two high frequency source signals having a predetermined phase shift by means of the high frequency amplifiers having source signals coupled in a coupler to form a high frequency output signal that is transmitted to the plasma load, wherein electrical variables related to the load impedances of the two high frequency amplifiers are determined, and an additional shift of the phases of the two drive signals is performed and consequently the phase shift of the high frequency source signals is adjusted so that neither of the high frequency amplifiers sees an unfavorable load impedance. By adjusting the phase shift, undue loading of at least one of the high frequency amplifiers can be avoided or reduced. The range in which the admissible load impedances are permitted to lie can be defined by means of the component specifications and the operating states of the HF amplifiers. The adjustment of the phase shift is preferably effected in such a way that the load impedances seen by the two HF amplifiers are led back into the admissible range.

The character of the load (impedance), in particular the phase angle thereof, can be determined. For that purpose, the particular phase angle between current and voltage at the outputs of the high frequency amplifiers can be measured or determined. In particular, instantaneous values of the HF current and the HF voltage can be measured and the amplitudes of HF current and HF voltage as well as the phase relation can be determined therefrom. It also suffices to determine the phase angle of the high frequency output signal at the output of a high frequency amplifier or at the third port of the hybrid coupler, as the two phase angles at the outputs of the high frequency amplifiers are in a fixed relationship, for example, of +/−90°. Instead of determining the impedance from high frequency current and high frequency voltage, it is also possible to ascertain the complex reflection factor from the high frequency signal running to the plasma load and from the high frequency signal coming from the plasma load, or from at least one high frequency source signal and a high frequency signal reflected to the relevant HF amplifier. In particular, the instantaneous values thereof can be detected and the amplitude and phase relation can be determined therefrom. More indirect determinations of the phase angles require the measurement of VSWR, voltage, power, current at least one port of the hybrid coupler or at the output of a high frequency amplifier. The complex values of the impedance Z and the complex reflection factors r can be transformed into one another by means of the relation $r=(Z-1)/(Z+1)$.

The dc power consumption of the two high frequency amplifiers can also be measured and their ratio with respect to one another can be used to estimate or determine the load impedances.

If an unfavorable phase angle for one of the high frequency amplifiers is now detected, i.e. a phase angle that indicates that the admissible load impedance range has been abandoned, the drive of the two high frequency amplifiers is changed by an additional phase shift in such a way that the high frequency power reflected from the plasma load to the high frequency amplifier represents no or a relatively slight loading, in particular only a relatively slight capacitive or emissive character of the load impedance for the relevant high frequency amplifier.

The phase shift can be effected in at least one of the drive signals. This results in a phase shift of the associated high frequency source signal.

Such a phase shift of the two generated high frequency source signals with respect to one another has three consequences: firstly, the coupler will no longer transmit the maximum high frequency output power to the plasma load, rather, a part of the high frequency output power will appear at port 4 and be absorbed in the terminating resistance. Secondly, the phase of the high frequency output signal differs by half the value of the additional phase shift from its original phase position. Thirdly, with a suitable choice of the additional phase shift, the high frequency signal reflected by the plasma load will have such a phase angle with respect to the generated high frequency source signal of the previously endangered amplifier that from now on the capacitive or emissive character of the impedance of its load is reduced or eliminated.

The powers of the two high frequency source signals generated can likewise be controlled. In this way, the high frequency output power can be maintained at a constant level.

Simultaneously with the adjustment of the phase shift, the output of at least one of the high frequency amplifiers can be regulated. Furthermore, the drive signal generator can control or regulate the output of at least one of the high frequency amplifiers. The drive signal generator can control or regulate the output of at least one of the high frequency amplifiers based on the adjustment of the phase shift.

A value for the adjustment of the phase shift can be derived from a table. In this connection, measured values of the phase angles of the load impedances can be allocated to different (additional) phase shifts in the table.

Alternatively, it is possible for the value for the adjustment of the phase shift to be determined in a self-learning manner. Thus, with time, an ever-improving adjustment of the phase shift of the drive signals is effected, so that the HF amplifiers are reliably protected.

In another aspect, the plasma supply device comprises a drive signal generator, which drives the two high frequency amplifiers, phase shifted, for example, by 90° with respect to one another, and a coupler, for example, a hybrid coupler, to the first and second port of which the outputs of the two high frequency amplifiers are connected, and to the third port of which a plasma load is at least indirectly connected, e.g. via an impedance matching circuit, at least one measuring device for determining electrical variables that relate to the load impedances of the high frequency amplifiers being present. Furthermore, a device for an additional phase shift of the two generated high frequency source signals with respect to one another, in particular based on the load impedances of the high frequency amplifiers, is provided. This device for the additional phase shift can likewise be embodied in the drive signal generator.

Preferred embodiments may include one or more of the following features.

The activation and the choice of the magnitude of the additional phase shift can be effected by means of a digital signal-processing unit; this signal-processing unit can contain a digital signal processor; this signal-processing unit can be contained in the drive signal generator. For the adjustment of the additional phase shift, the measured values can be evaluated by means of a table and thus the additional phase shift can be selected. The algorithm or the table that selects the additional phase shift can be self-learning. The additional phase shift can be part of a control loop.

The drive signal generator may also control or regulate the output of at least one of the high frequency amplifiers, in particular based on the additional phase shift, in order, for example, to maintain the high frequency output power at a constant level.

The high frequency source signals can be coupled with a hybrid coupler. Alternatively, it is possible to direct one of the high frequency source signals via a phasing line, for example, a 90° phasing line, and then to couple the signals with a coupler, for example, a 0° coupler.

Preferred exemplary embodiments are represented diagrammatically in the drawing and are explained in greater detail in the following with reference to the figures in the drawing.

DESCRIPTION OF DRAWINGS

Identical elements are denoted by the same reference numerals.

DETAILED DESCRIPTION

Figure 1:
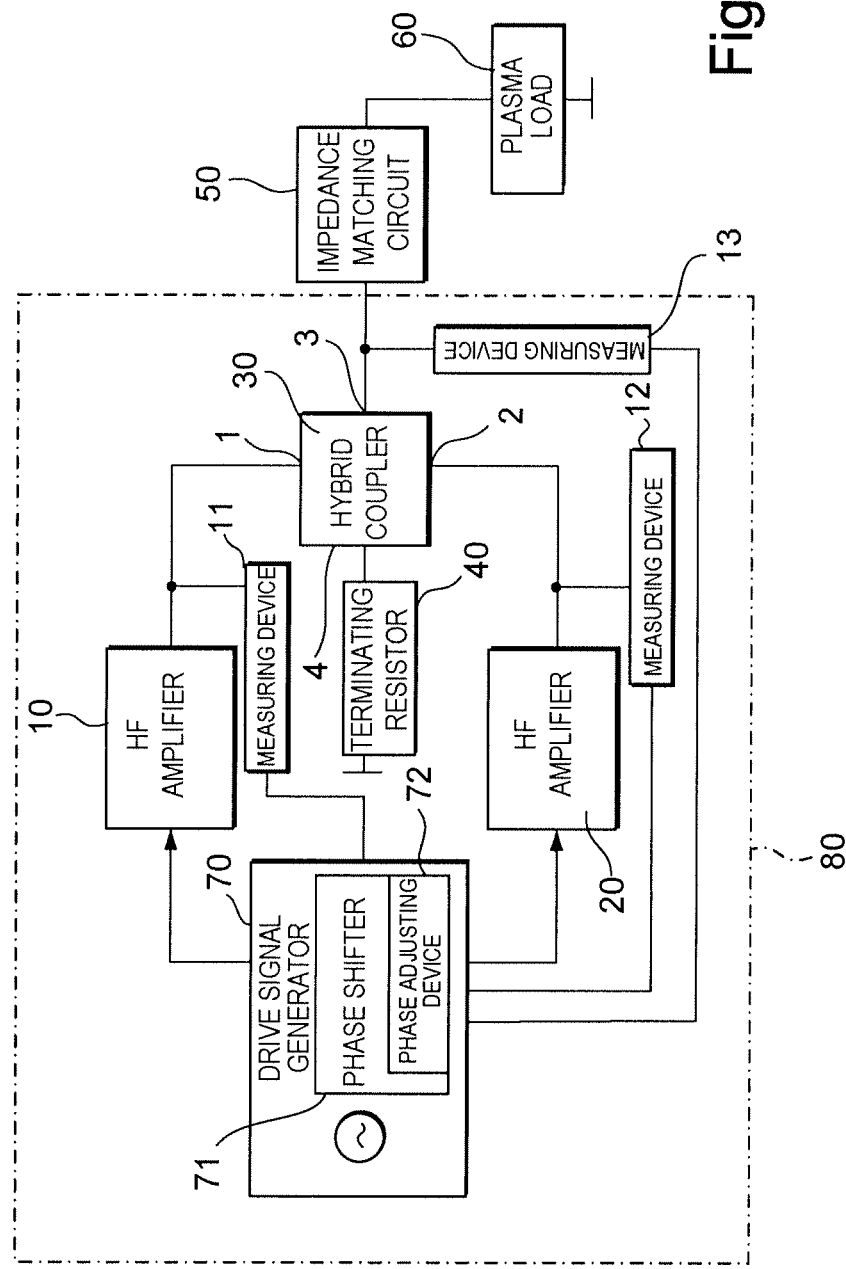
FIG. 1 shows a schematic illustration of a plasma supply device.

FIG. 1 is a schematic illustration of a plasma supply device 80, which comprises two high frequency amplifiers 10, 20, each with at least one switching element, a hybrid coupler 30 having four ports 1, 2, 3, 4, a terminating resistor 40, and also a drive signal generator 70. Connected to the output of the plasma supply device 80, which is connected to the port 3, is an impedance matching circuit 50, and connected to this is the plasma load 60, here illustrated merely as an impedance.

The two high frequency amplifiers 10, 20 are connected to the ports 1 and 2 respectively and each deliver a high frequency source signal to the hybrid coupler 30, the high frequency amplifier 10 being driven so that its signal has a phase lead of 90° compared with the signal of the high frequency amplifier 20.

The two high frequency amplifiers 10, 20 are driven phase-shifted by 90° by the drive signal generator 70. For that purpose, a first phase shifter 71 is formed in the drive signal generator 70.

The hybrid coupler 30 delays the high frequency source signal of the high frequency amplifier 10 en route from port 1 to port 3 by a phase angle of 45°, whilst it allows the high frequency source signal of the high frequency amplifier 20 to lead by 45° en route from port 2 to port 3. Consequently, both generated high frequency signals are present constructively superposed at port 3.

En route to port 4, the situations are reversed. The hybrid coupler 30 lets the high frequency source signal of the high frequency amplifier 10 lead by 45° en route from port 1 to port 4, whilst it allows the high frequency source signal of the high frequency amplifier 20 to lag by 45° en route from port 2 to port 4. Consequently, both generated high frequency source signals are present destructively superposed at port 4 and thus cancel each other out.

Any high frequency signals reflected by the plasma load 60 and the impedance matching circuit 50 return to the port 3 of the directional coupler 30, are split there and transmitted via the two ports 1, 2 towards the two high frequency amplifiers 10, 20.

Measuring devices 11, 12, 13 determine measured values from which an adjustment of the phase shift or additional phase shift of the drive signals is determined in the drive signal generator 70, in particular in a phase adjusting device 72 that in the exemplary embodiment is integrated in the first phase shifter 71. By way of the measuring device 13 it is also possible to detect the actual output, by means of which in the drive signal generator 70 the drive signals are changed in such a way that an adjustment to a desired output is effected.

Figure 2A:
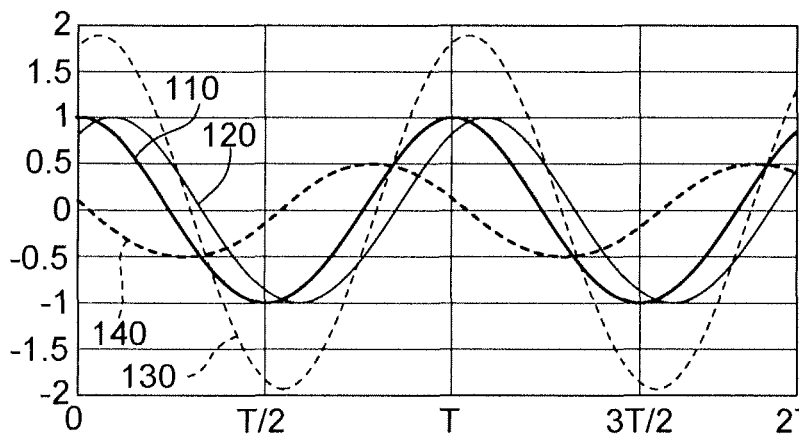
FIGS. 2a-2c show variations with time of different HF voltages and HF currents at the ports of a hybrid coupler without additional phase shifting.
Figure 2B:
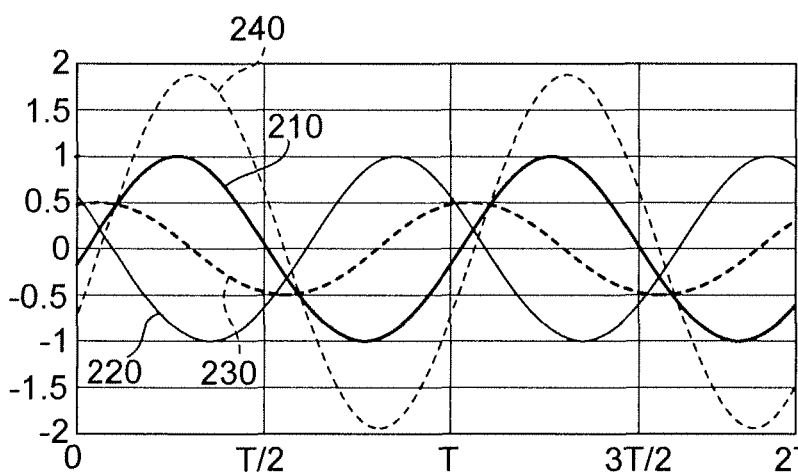
Figure 2C:
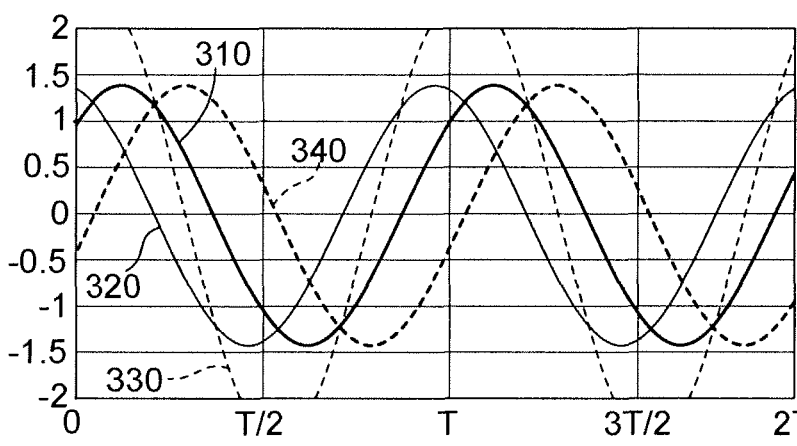

FIGS. 2a-2c show the variations with time of different high frequency voltages and the resulting high frequency currents at the ports 1 to 3 of the hybrid coupler 30 over two periods T of the fundamental frequency. The reflection coefficient |Γ| is 1 and the total phase shift φ at port 3 of the hybrid coupler 30, caused by the feed lines to the impedance matching circuit 50 and to the plasma load 60 and by these units themselves, is 60° in the exemplary embodiment.

FIG. 2a shows the conditions at port 1 of the hybrid coupler 30. The high frequency voltage 110 is the voltage of the high frequency source signal generated by the high frequency amplifier 10. FIG. 2b shows the conditions at port 2 of the hybrid coupler 30. The high frequency voltage 210 is the voltage of the high frequency signal generated by the high frequency amplifier 20. FIG. 2c shows the high frequency voltage 310 of the high frequency output signal running to the plasma load at port 3. Compared with the high frequency voltage 110, the high frequency voltage 310 lags by 45°, compared with the high frequency voltage 210, the high frequency voltage 310 leads by 45°. These time offsets with which the high frequency source signals are generated in the high frequency amplifiers 10, 20 compensate for the phase lag or phase lead that the generated high frequency source signals experience in the hybrid coupler. Thus the high frequency voltage 310 is the superposition of the high frequency voltages 110 and 210; the amplitude of the high frequency voltage 310 is $\sqrt{2}$ times as large as that of the high frequency voltages 110 and 210, the resulting power of the high frequency output signal is therefore twice as large.

The high frequency voltage 320 in FIG. 2c is the high frequency voltage of the high frequency signal reflected by the plasma load at port 3 of the hybrid coupler 30. Owing to the reflection factor |Γ|, its amplitude is just as large as that of the high frequency voltage 310. The high frequency voltage 320 of the reflected high frequency signal leads the high frequency voltage 310 of the high frequency signal running to the plasma load by a phase angle of 60°. The two high frequency voltages 310 and 320 superimpose on each other to form the high frequency voltage 330. The high frequency current resulting from the two high frequency voltages 310, 320 is denoted by 340. The high frequency voltage 310 of the high frequency signal running to the plasma load makes a positive contribution to the high frequency current 340, whereas the high frequency voltage 320 of the reflected high frequency signal yields a negative contribution.

The high frequency signal of the high frequency voltage 320 reflected by the plasma load at port 3, after splitting by the hybrid coupler 30, forms at port 1 the high frequency voltage 120 in FIG. 2a and at port 2 the high frequency voltage 220 in FIG. 2b. On the return path through the hybrid coupler from port 3 to port 1 and from port 3 to port 2, the split high frequency signals respectively lag and lead by the same phase angle as the forward running high frequency source signals generated by the high frequency amplifiers 10, 20; the high frequency voltage 120 at port 1 lags by 45° with respect to the high frequency voltage 320 at port 3, the high frequency voltage 220 at port 2 leads by 45° with respect to the high frequency voltage 320 at port 3. The resulting high frequency voltage 130 and also the resulting high frequency current 140 at port 1 are illustrated in FIG. 2a, the resulting high frequency voltage 230 and also the resulting high frequency current 240 at port 1 are illustrated in FIG. 2b.

As can be seen from FIG. 2a, the resulting high frequency current 140 leads the resulting high frequency voltage 120; the high frequency amplifier 10 sees a load impedance with a capacitive character (a capacitive load impedance). In FIG. 2b, the resulting high frequency current 240 lags with respect to the resulting high frequency voltage 230; the high frequency amplifier 20 therefore sees a load impedance with an inductive character (an inductive load impedance).

Figure 3A:
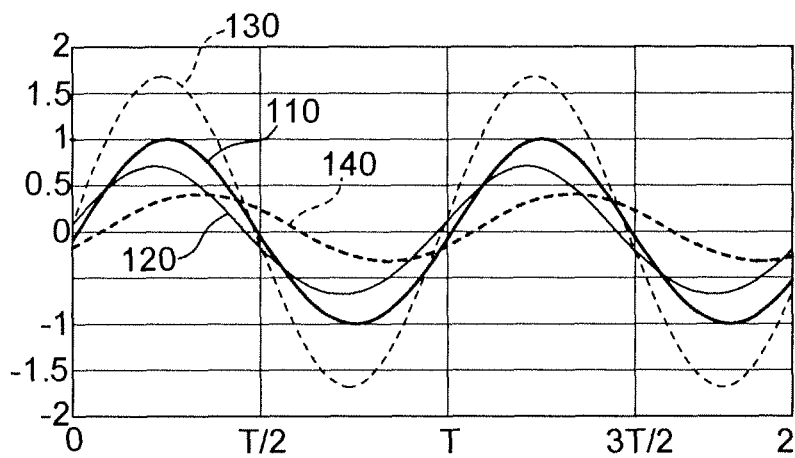
FIGS. 3a-3c show variations with time of different HF voltages and HF currents at the ports of a hybrid coupler with additional phase shifting of the drive signals of the HF amplifiers.
Figure 3B:
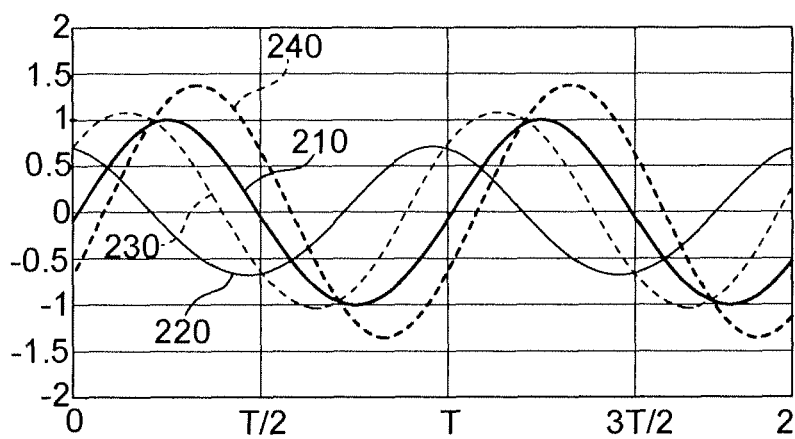
Figure 3C:
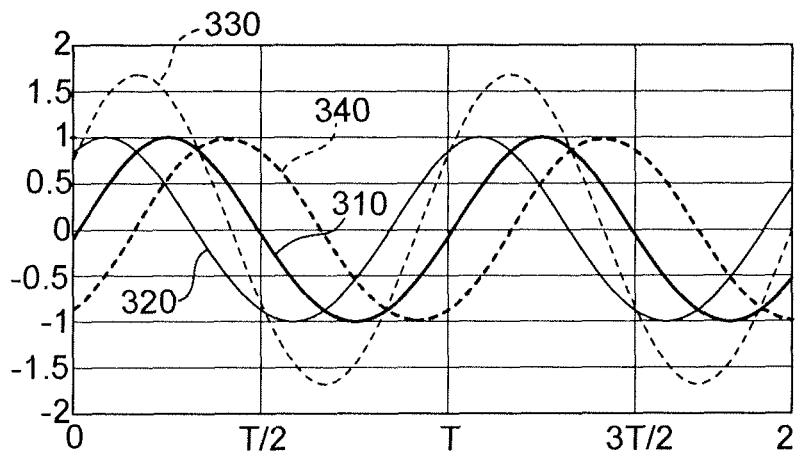

In order to avoid the unfavorable capacitive character of the load impedance for the high frequency amplifier 10, the high frequency amplifier 10 is driven by the drive signal generator 70 delayed by an additional phase shift of 90°, as can be seen in FIG. 3. The reflection coefficient |Γ| of 1 and the phase shift φ of 60°, caused by the components of the plasma supply device 80 and by the impedance matching circuit 50 and plasma load 60, were retained. In FIG. 3c it can be seen that the high frequency voltage 310 of the high frequency output signal has been reduced by $1/\sqrt{2}$, and thus, the corresponding high frequency output power has been reduced by half. The other half of the high frequency output power is now emitted at port 4 of the hybrid coupler 30 and absorbed in the terminating resistance 40. The character of the load impedance for the high frequency amplifier 20 is still inductive, as can be recognized by the high frequency current 240 lagging with respect to the generated high frequency voltage 230 in FIG. 3b. As can be seen from FIG. 3a, the high frequency amplifier 10 also now sees a load impedance with an inductive character, for here too the high frequency current 140 lags behind the generated high frequency voltage 130.

Figure 4A:
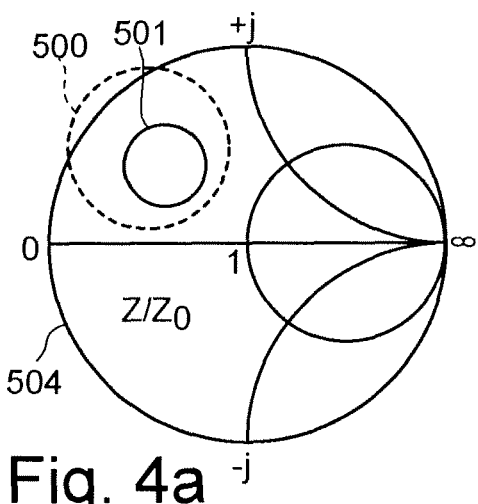
FIG. 4a shows a first illustration of admissible load impedance ranges in a Smith diagram.
Figure 4B:
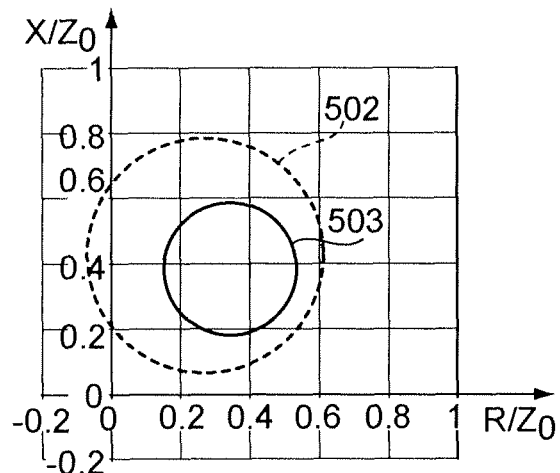
FIG. 4b shows a first illustration of admissible load impedance ranges in the complex impedance plane.

FIG. 4a shows a Smith diagram. Admissible load impedance ranges 500, 501 are exemplified using circles. In FIG. 4b, corresponding ranges 502, 503 are shown in an illustration in the complex impedance plane. The illustrations in both FIGS. 4a, 4b are standardized to the system impedance Z0.

The ranges 500, 502 indicate a working range that would be possible in conservative operation, that is, e.g. when the operating voltage specification of the switching elements of the HF amplifier is not fully exploited. The ranges 501, 503 indicate a working range for amplifiers that are operated to the limits of their specifications.

The ranges 500, 502 even cross over into the emissive load impedance range (outside the Smith circle, left half-plane), both remain still inductive (upper circle half and upper half-plane respectively).

The ranges are similarly definable in the Smith diagram and in the complex impedance plane and are transferable into each other. The construction rules for certain geometries may, however, differ for the two diagrams.

Different measurements are possible to determine whether a load impedance lies in a defined range or outside it.

The angle between the high frequency power running to the plasma load and the high frequency power reflected by the load gives the angle in the Smith diagram. The angle between high frequency voltage and high frequency current gives the angle in the complex impedance plane.

The HF output powers run outwards (forward) and (the reflected HF output powers) return; they can be measured independently of one another by directional couplers.

The measurement (of the instantaneous value) of the outgoing and returning HF (power) signal gives a radius in the Smith diagram. If it is zero, there is no reflection (midpoint of the Smith diagram), if it is one, the reflection is 100% (outer edge of the Smith diagram). A larger returning than outgoing power is represented by a point outside the large circle 504. For the position in the Smith diagram, apart from the reflection factor, further information, namely the phase, is needed. The phase angle (and as a result the load impedance) between outgoing and returning power is the phase around the midpoint.

During a voltage/current value measurement (again the instantaneous values), it is no longer possible to distinguish between forward and reverse running voltage waves and forward and reverse running current waves; they superimpose additively (voltage) and subtractively (current). The measurement of current and voltage amplitudes defines a radius around the origin in the complex impedance plane, in extreme cases therefore short circuit (no voltage, resistance=0, origin) and open-circuit operation (no current, at infinity). The phase angle (and as a result the phase angle of the load impedance) is likewise obtained with additional measurement of the phase.

Both methods (forward/reverse power, voltage/current) are equivalent and connected to one another by the transformation r=(Z−1)/(Z+1) [r complex reflection factor for the Smith diagram, Z complex resistance for the impedance plane]. Each measurement with the one method can be converted into values of the other method.

Figure 5A:
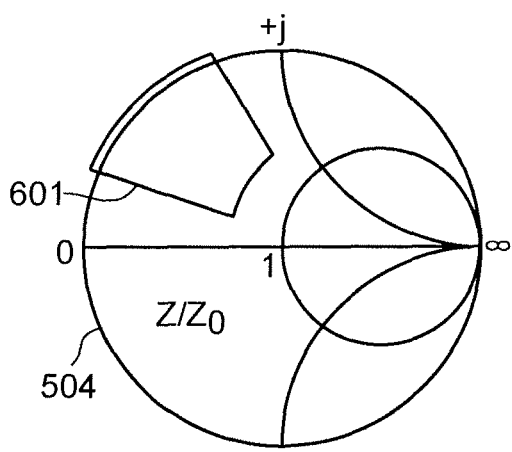
FIG. 5a shows a second illustration of an admissible load impedance range in a Smith diagram.
Figure 5B:
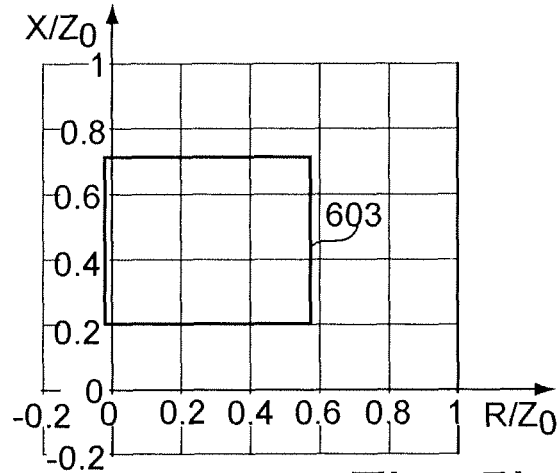
FIG. 5b shows a second illustration of an admissible load impedance range in the complex impedance plane.
Figure 6A:
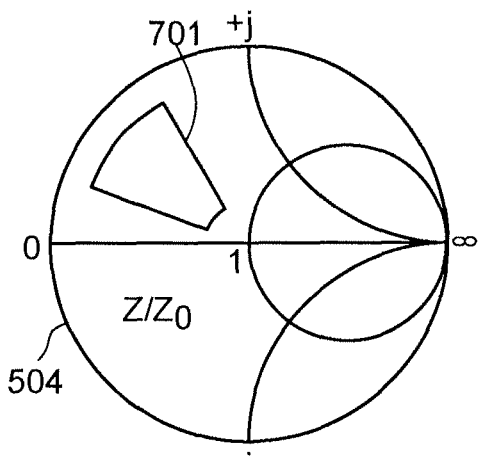
FIG. 6a shows a third illustration of an admissible load impedance range in a Smith diagram.
Figure 6B:
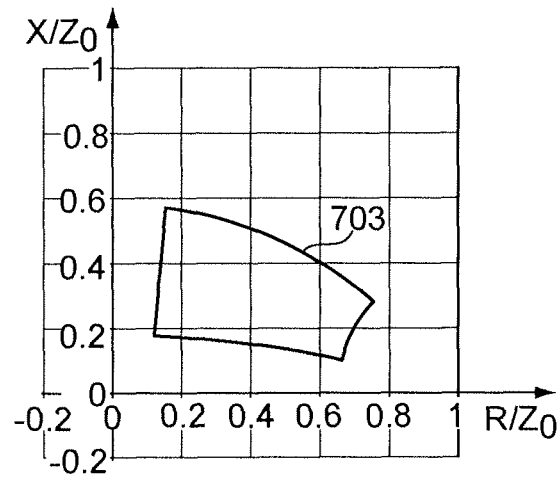
FIG. 6b shows a third illustration of an admissible load impedance range in the complex impedance plane.

FIGS. 5a, 5b show admissible impedance ranges 601, 603 with alternatively selected geometrical form. The range 601 can be transformed by a transformation into the range 603 and vice versa. It is immaterial for the invention in what illustration the admissible load impedance ranges are defined. The FIGS. 6a, 6b shows admissible load impedance ranges 701, 703, wherein the range 701 was predetermined and the range 703 resulted from a transformation of the range 701.

What is claimed is:

1. A method of protecting high-frequency amplifiers of a plasma supply device configured to deliver a high-frequency output signal having a power of more than 500 W and a substantially constant fundamental frequency greater than 3 MHz to a plasma load, the method comprising:
    driving two high frequency amplifiers with two drive signals having a common frequency and a predetermined phase shift with respect to one another;
    generating two high frequency source signals using the two high frequency amplifiers, the two high frequency source signals being coupled in a coupler to form a combined high frequency output signal;
    transmitting the combined high frequency output signal to the plasma load;
    measuring electrical variables related to load impedances seen by the two high frequency amplifiers;
    determining load impedances seen by the two high frequency amplifiers; and
    in response to determining that the load impedance seen by one of the two high frequency amplifiers lies outside a predetermined range, adjusting the phase shift of the two drive signals sufficiently to cause a phase shift of the high frequency source signals with respect to one another, the phase shift of the high frequency source signals causing the load impedances seen by the two high frequency amplifiers to lie within the predetermined range.

2. The method of claim 1, further comprising determining a phase angle of the load impedance seen by at least one of the two high frequency amplifiers, or a variable related thereto.

3. The method of claim 1, further comprising determining an instantaneous value of a high frequency signal supplied to the plasma load and reflected by the plasma load, or the instantaneous value of a high frequency voltage and a high frequency current at a port of the coupler or at an output of one of the two high frequency amplifiers.

4. The method of claim 1, wherein measuring the electrical variables comprises measuring D.C. power consumption.

5. The method of claim 1, wherein adjusting the phase shift of the two drive signals includes adjusting a phase angle of one of the drive signals.

6. The method of claim 1, further comprising regulating an output of at least one of the high frequency amplifiers while adjusting the phase shift of the two drive signals.

7. The method of claim 1, further comprising controlling an output of at least one of the high frequency amplifiers using a drive signal generator.

8. The method of claim 1, further comprising controlling an output of at least one of the high frequency amplifiers based on the adjustment of the phase shift of the two drive signals, using a drive signal generator.

9. The method of claim 1, wherein adjusting the phase shift of the two drive signals comprises determining an adjustment value from a table.

10. A plasma supply device configured to generate and supply an output power of more than 500 W at a substantially constant fundamental frequency greater than 3 MHz in the form of a high-frequency output signal to a plasma load, the plasma supply device comprising:
   a first phase shifter;
   two high frequency amplifiers, each having at least one switching element and an output;
   a drive signal generator configured to drive the two high frequency amplifiers with a predetermined phase shift using the first phase shifter;
   a coupler having first and second ports coupled to respective outputs of the two high frequency amplifiers, and having a third port at least indirectly connected to the plasma load;
   a sensor coupled between the coupler and one of the two high frequency amplifiers and responsive to an electrical variable indicative of load impedances seen by the two high frequency amplifiers; and
   a phase adjuster configured to cooperate with the drive signal generator to adjust the phase shift of the drive signals of the high frequency amplifiers with respect to one another based on input from the sensor.

11. The plasma supply device of claim 10, wherein the phase adjuster is integrated in the first phase shifter.

12. The plasma supply device of claim 10, wherein the phase adjuster is in the form of a second phase shifter.

13. The plasma supply device of claim 10, wherein at least one of the first phase shifter and the phase adjuster are formed in the drive signal generator.

14. The plasma supply device of claim 10, wherein the drive signal generator comprises a digital circuit configured to select a phase shift adjustment value.

15. The plasma supply device of claim 14, wherein the digital circuit is a digital signal processor.

16. The plasma supply device of claim 10, wherein the coupler is in the form of a hybrid coupler.

* * * * *

UNITED STATES PATENT AND TRADEMARK OFFICE
CERTIFICATE OF CORRECTION

PATENT NO. : 8,421,377 B2  
APPLICATION NO. : 12/686023  
DATED : April 16, 2013  
INVENTOR(S) : Kirchmeier et al.

Page 1 of 1

It is certified that error appears in the above-identified patent and that said Letters Patent is hereby corrected as shown below:

On the title page, item [54] and in the Specification, column 1, line 2, delete "AMPLIFERS" and insert --AMPLIFIERS--.

Signed and Sealed this  
First Day of October, 2013

Teresa Stanek Rea  
*Deputy Director of the United States Patent and Trademark Office*